(12) United States Patent
Pasqualoni et al.

(10) Patent No.: US 6,749,488 B2
(45) Date of Patent: Jun. 15, 2004

(54) CHEMICAL MECHANICAL POLISHING SLURRY COMPOSITION FOR POLISHING CONDUCTIVE AND NON-CONDUCTIVE LAYERS ON SEMICONDUCTOR WAFERS

(75) Inventors: Anthony Mark Pasqualoni, Hamden, CT (US); Deepak Mahulikar, Madison, CT (US); Larry A. LaFollette, Maumee, OH (US); Richard J. Jenkins, Dundee, MI (US)

(73) Assignee: Planar Solutions LLC, Adrain, MI (US)

( * ) Notice: Subject to any disclaimer, the term of this patent is extended or adjusted under 35 U.S.C. 154(b) by 0 days.

(21) Appl. No.: 10/268,254

(22) Filed: Oct. 9, 2002

(65) Prior Publication Data

US 2003/0064671 A1 Apr. 3, 2003

Related U.S. Application Data

(62) Division of application No. 09/845,549, filed on Apr. 30, 2001, now abandoned.

(51) Int. Cl.⁷ ................................................ B24B 1/00
(52) U.S. Cl. ........................... 451/41; 451/36; 438/692; 438/693; 156/345.11; 156/345.12
(58) Field of Search ..................... 451/41, 36; 438/692, 438/693; 156/345.11, 345.12

(56) References Cited

U.S. PATENT DOCUMENTS

| | | |
|---|---|---|
| 3,170,273 A | 2/1965 | Walsh et al. |
| 3,527,028 A | 9/1970 | Oswald |
| 4,050,954 A | 9/1977 | Basi |
| 4,169,337 A | 10/1979 | Payne |
| 4,304,575 A | 12/1981 | Payne |
| 4,462,188 A | 7/1984 | Payne |
| 5,139,571 A | 8/1992 | Deal et al. |
| 5,230,833 A | 7/1993 | Romberger et al. |
| 5,246,624 A | 9/1993 | Miller et al. |
| 5,314,843 A | 5/1994 | Yu et al. |
| 5,340,370 A | 8/1994 | Cadien et al. |
| 5,607,718 A | 3/1997 | Sasaki et al. |
| 5,656,097 A | 8/1997 | Olesen et al. |
| 5,695,384 A | 12/1997 | Beratan |
| 5,750,440 A | 5/1998 | Vanell et al. |
| 5,770,095 A | 6/1998 | Sasaki et al. |
| 5,908,509 A | 6/1999 | Olesen et al. |
| 5,954,997 A | 9/1999 | Kaufman et al. |
| 5,980,775 A | 11/1999 | Grumbine et al. |
| 5,993,685 A | 11/1999 | Currie et al. |
| 5,996,595 A | 12/1999 | Olesen et al. |
| 6,010,962 A | 1/2000 | Liu et al. |
| 6,362,106 B1 * | 3/2002 | Kaufman et al. ........... 438/692 |
| 6,409,781 B1 * | 6/2002 | Wojtczak et al. ............. 51/308 |
| 6,447,371 B2 * | 9/2002 | Kaufman et al. ............. 451/36 |
| 6,514,864 B2 | 2/2003 | Nakabayashi et al. ...... 438/692 |
| 6,541,384 B1 * | 4/2003 | Sun et al. ................... 438/692 |

OTHER PUBLICATIONS

"Initial Study of Copper MCP Slurry Chemistries" (Thin Solid Films, 1995), Carpio et al.
"Chemical–Mechanical Polishing of Copper for Interconnect Formation" (Microelectronoc Engineering, 1997), Stavreva et al.
"Development of a 1:1:1 Slurry for Tantalum Layer Polishing" (in proceedings of the CMP–MIC conference, Feb. 1997).
"Chemical–Mechanical Polishing of Copper in Glycerol Based Slurries" (Materials Research Society Symposium Proceedings, 1996), Kumar et al.
Chemical–Mechanical Polishing of Copper with Oxide and Polymer Interlevel Dielectrics (Thin Solid Films, 1995), Gutman et al.
"Stabilization of Alumina Slurry for Chemical–Mechanical Polishing of Copper" (Langmuri, 1996), Lou et al.

\* cited by examiner

*Primary Examiner*—Eileen P. Morgan
(74) *Attorney, Agent, or Firm*—Ohlandt, Greeley, Ruggiero & Perle, L.L.P.

(57) ABSTRACT

The invention relates to a novel CMP slurry composition used for polishing metals, the composition comprising: (a) a dispersion solution comprising an abrasive; and (b) an oxidizer. The slurry composition has a large particle count of less than about 150,000 particles having a particle size greater than 0.5 $\mu$m in 30 $\mu$L of slurry, which is achieved by filtering the slurry composition prior to use. Also, the inclusion of a chemical activity enhancer, such as, an amine and a corrosion inhibitor, results in the appropriate copper removal rate without increasing static etch rates.

2 Claims, No Drawings

CHEMICAL MECHANICAL POLISHING SLURRY COMPOSITION FOR POLISHING CONDUCTIVE AND NON-CONDUCTIVE LAYERS ON SEMICONDUCTOR WAFERS

This is a divisional of application Ser. No. 09/845,549, filed on Apr. 30, 2001 now abandoned.

The present invention relates to a chemical mechanical polishing slurry system used in semiconductor manufacturing. More particularly, the present invention relates to a chemical mechanical polishing slurry system that has a lower incidence of defects.

BACKGROUND OF THE INVENTION

Semiconductors are typically made up of millions of active devices that are connected together via metal interconnections to form circuits and components. The active devices are interconnected by a well-known multilayer interconnect process. In a typical interconnect process, alternating layers of metal and dielectric are put on the silicon wafer by a variety of processes. After each layer is applied, a means is used to remove excess amounts of these layers and to assure both local and global planarity of the surface in preparation for the application of the next layer.

A common process used to accomplish these goals is chemical mechanical planarization (CMP). In this process, an aqueous solution containing various chemicals and suspended abrasive particles, namely, a slurry, is interposed between the wafer and a moving pad while pressure is applied. The combination of the mechanical effects of the abrasive particles, applied pressure, imposed relative velocity and the chemical effects which result from chemical reaction between the material being polished and constituents in the solution result in a synergistic enhancement of the polishing rate or material removal rate. That is, the material removal rate is higher than that produced by either the mechanical effects or chemical effects alone.

There are two general types of layers that can be polished. The first layer is interlayer dielectrics (ILD), such as, silicon oxide and silicon nitride. The second layer is metal layers, such as, tungsten, copper, aluminum, etc., which are used to connect the active devices.

In the case of CMP of metals, the chemical action is generally considered to take one of two forms. In the first mechanism, the chemicals in the solution react with the metal layer to continuously form an oxide layer on the surface of the metal. This generally requires the addition of an oxidizer to the solution, such as, hydrogen peroxide, ferric nitrate, etc. Thereafter, the mechanical abrasive action of the particles continuously and simultaneously removes this oxide layer. A judicious balance of these two processes obtains optimum results in terms of removal rate and polished surface quality.

In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal, enhancing the diffusion of reactants and products to and away from the surface by mixing, and by reducing the thickness of the boundary layer.

A number of systems for chemical-mechanical polishing of copper have been disclosed. Kumar et al. in an article entitled "Chemical-Mechanical Polishing of Copper in Glycerol Based Slurries" (*Materials Research Society Symposium Proceeding*, 1996) disclose a slurry that contains glycerol and abrasive alumina particles. An article by Gutmann et al. entitled "Chemical-Mechanical Polishing of Copper with Oxide and Polymer Interlevel Dielectrics" (*Thin Solid Films*, 1995) discloses slurries based on either ammonium hydroxide or nitric acid that may contain benzotriazole (BTA) as an inhibitor of copper dissolution. Luo et al. in an article entitled "Stabilization of Alumina Slurry for Chemical-Mechanical Polishing of Copper" (*Langmuir*, 1996) discloses alumina-ferric nitrate slurries that contain polymeric surfactants and BTA. Carpio et al. in an article entitled "Initial Study on Copper CMP Slurry Chemistries" (*Thin Solid Films*, 1995) disclose slurries that contain either alumina or silica particles, nitric acid or ammonium hydroxide, with hydrogen peroxide or potassium permanganate as an oxidizer.

There are a number of theories as to the mechanism for chemical-mechanical polishing of copper. An article by Zeidler et al. (*Microelectronic Engineering*, 1997) proposes that the chemical component forms a passivation layer on the copper, changing the copper to a copper oxide. The copper oxide has different mechanical properties than metallic copper, such as, density and hardness, and passivation changes the polishing rate of the abrasive portion. The above article by Gutmann et al. discloses that the mechanical component abrades elevated portions of copper and the chemical component then dissolves the abraded material. The chemical component also passivates recessed copper areas minimizing dissolution of those portions.

Planar Solutions has developed a basic slurry for the CMP of copper, tantalum and TEOS layers. This is described in a publication titled "Development of a 1:1:1 TA: Copper layer: TEOS layer slurry for Tantalum layer polishing" in the proceedings of the CMP MIC conference, February 1999. In a two step process to CMP the copper layer, in the first step the slurry polishes the copper layer rapidly, while in the second step, the slurry polishes the tantalum layer, the copper layer, and the TEOS layer simultaneously. The prior art slurry was designed to have no selectivity towards these layers and the topography performance was excellent. The topography has been reported to be in the 100–300 Å range. However, the prior art slurry has two distinct disadvantages associated with it, namely, defectivity and oxide thinning or total copper loss.

The defectivity issue revolves around several chatter mark defects revealed in the copper layer after CMP. After polishing with the prior art slurry, the polished substrate, when viewed at 200×magnification at nine sites, had several hundred chatter mark defects (hereafter referred to as a normalized defectivity of 100). The chatter mark defects were deep and were cosmetically unacceptable.

The oxide thinning is primarily associated with the high removal rate of the TEOS layer. The prior art slurry removed the TEOS layer more rapidly than the tantalum layer or the copper layer. For example, typical removal rates were TEOS layer: 1500 Å/min, tantalum layer: 600 Å/min, and copper layer: 900 Å/min. As a result of the high oxide thinning, thicker TEOS layers will have to be deposited, which will result in subsequent increased costs.

The present invention overcomes the disadvantages of the current metal slurry compositions so that defectivity and oxide thinning or total copper loss are significantly reduced and/or eliminated. The present invention also provides many additional advantages, which shall become apparent as described below.

SUMMARY OF THE INVENTION

The present invention relates to a novel CMP slurry composition used for polishing metals comprising (a) a dispersion solution comprising an abrasive; and (b) an oxidizer. The slurry composition has a large particle count of less than about 150,000 particles having a particle size greater than 0.5 µm in 30 µL of slurry, which is achieved by filtering the slurry composition prior to use. By controlling the particle size of the abrasive dispersion, through either filtration of the dispersion itself or the slurry composition before use, defectivity and oxide thinning/total copper loss problems are significantly reduced and/or eliminated. Also, the inclusion of a chemical activity enhancer, such as, an amine and a corrosion inhibitor, results in the appropriate copper removal rate without increasing static etch rates, which cause increased topography.

The slurry composition may also comprise at least one other component selected from the group consisting of: acids, chelating agents, fluorine-containing compounds, buffering agents, salts, and biological agents.

DETAILED DESCRIPTION OF THE INVENTION

It has been found that by reducing the number of abrasive large particles, in combination with optimizing chemical activity, in a CMP slurry composition, defectivity and oxide thinning/total copper loss on the substrate being polished is significantly reduced and/or eliminated. The defectivity and oxide thinning/total copper loss depends on two critical factors: (1) the number of large particles present in the slurry composition, and (2) the chemical activity of the slurry composition.

For the purpose of this patent application, the term "particle" includes, but is not limited to, colloids, aggregates and other fused combinations of particles, as well as agglomerates and other solely mechanically interwoven combinations of particles. "Large particle count" is intended to mean a count of particles where the particles have a particle size greater than about 0.5 µm. The term "particle size" is intended to mean an average diameter size of a distribution of particles.

To count particles and measure particle size, there are many suitable methods known in the art. Preferably, the particle count and size is measured by an Accusizer, manufactured, for example, by Particle Sizing Systems. To measure particle count and size using an Accusizer, an amount of sample containing particles is diluted with about 1 milliliter (mL) of water and then introduced into the Accusizer. The Accusizer then measures the particle count and size of the particles contained in the sample. The particle count is proportional to the amount of sample analyzed. For example, when analyzing about 30 microliters (µL) of the slurry of the present invention, diluted with about 1 mL of water, in an Accusizer, less than about 150,000 particles having a particle size greater than about 0.5 (micrometers) µm are measured. If 60 µL of the same slurry of the present invention were diluted with 1 mL of water, the Accusizer would measure less than about 300,000 particles having a particle size greater than about 0.5 µm.

The CMP slurry of the present invention comprises an abrasive dispersion and an oxidizer. The abrasive particles may be any material that is effective at removing metal and silicon layers. Silica is the abrasive material used in the present invention. The silica may be, for example, colloidal silica, fumed silica and other silica dispersions; however, the preferred silica is fumed silica. Preferably, the silica is present in the slurry in a concentration of about 4% to 10% of the total weight of the slurry. More preferably, the silica is present in a concentration of about 5% to 9% of the total weight of the slurry. Most preferably, the silica is present in a concentration of about 6.5% to 8% of the total weight of the slurry.

In addition, other ceramics, such as, for example, alumina ($Al_2O_3$), ceria ($CeO_2$), and mixtures thereof may also be utilized as an abrasive in the slurry composition.

To reduce the number of large particles contained in the slurry composition, the slurry composition is filtered before its use. Preferably, the slurry composition is filtered at least once prior to its use. More preferably, the slurry composition is filtered at least three times prior to its use. Alternatively, the abrasive dispersion can be filtered prior to being admixed with the other chemical components that make up the slurry composition.

The slurry composition can be filtered using any filtration process known in the art. By way of example, the filtration process may include one or more stages of filtration in series starting with coarse filters ( i.e., bag filters) followed by cartridge type filters. Typically, filtration could begin with one or more very coarse ( i.e., 50 micron) filters and then be followed by one or more fine pore size filters (i.e., 0.5 micron). Filtration time can vary depending on the amount of the slurry composition to be filtered. For example, the slurry can be filtered at a flow rate between about 0.5 to 10 gallons per minute.

As a result of the filtration, chatter mark defects on a polished substrate are significantly reduced, as shown in Tables 1 and 2 below.

TABLE 1

Chatter mark defects versus large particle counts

| Large Particle Counts Normalized | Chatter mark defects |
|---|---|
| 100 | >100 |
| 10 | ~100 |
| 5 | 20–40 |
| 2 | <10 |

TABLE 2

Results of test polishes

| Test Condition | # Particles > 0.5 µm (Accusizer) | # Chattermark Defects |
|---|---|---|
| Fumed Silica Slurry | 150,000 | 0 |
| Agitated K1020 | 737,000 | 33230 |
| Unagitated K1020 | 356,000 | 6820 |
| Unfiltered K1020 | 670,000 | 6800 |
| Filtered K1020 | 360,000 | 4700 |
| Colloidal $SiO_2$ (Klebesol 1501) | 50,000 | 900 |
| A5012 Ta Slurry | 360,000 | 550 |

The slurries listed in Table 2, with the exception of the colloidal silica slurry, are fumed silica based slurries. All of the slurries, except for the A5012 Ta slurry, are KOH stabilized and include hydrogen peroxide and BTA. The A5012 Ta slurry is fumed silica based, but ammonia stabilized. The ammonia ion attacks copper reducing chatter mark defects. Unless noted otherwise, each slurry was filtered, resulting in different large particle counts in the slurry compositions.

When there is a lack of significant chemical activity, the defects varied directly with the number of coarse particles (>0.5 μm) present. A slurry with a higher chemical activity, such as an acidic slurry or an ammonia based slurry, such as A5012, reduced the chatter mark defects significantly. A single patterned wafer exhibiting few chatter mark defects was polished using a fumed silica slurry, which was filtered several times and had a very low particle count, i.e., less than about 150,000 particles having a particle size greater than about 0.50 μm, in a 30 μL sample. This resulted in zero chatter mark defects on the polished wafer.

By reducing the fumed silica concentration in the slurry composition to about 6.5% to 8% of the total weight of the slurry, the TEOS layer removal rate dropped from 1500 Å/min to about 1200 Å/min. In addition, the copper and tantalum removal rates were reduced. To combat these reductions, the oxidizer concentration was systematically reduced, which resulted in an increased tantalum layer removal rate, as demonstrated by Table 3 below.

TABLE 3

Tantalum and copper removal rates versus oxidizer concentration

| Oxidizer Concentration Normalized | Tantalum layer removal rate Å/min. | Copper layer removal rate Å/min. |
|---|---|---|
| 100 | 250 | 800 |
| 50 | 400 | 250 |
| 0 | 1000 | 50 |

Hydrogen peroxide ($H_2O_2$) is used as the oxidizing agent in the present invention. Preferably the concentration of the $H_2O_2$ is from about 0.01% to 10% of the total weight of the slurry. When used with fumed silica, the $H_2O_2$ is present in a concentration from about 0.05% to 0.50% of the total weight of the slurry.

Other suitable oxidizing agents may be utilized. For example, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, various ammonium salts such as ammonium persulfate, potassium permanganate, and mixtures thereof, are suitable oxidizing agents.

In order to further enhance the chemical activity of the slurry composition, additional chemicals may be added to the CMP slurry composition, including, for example, corrosion inhibitors, amines, stabilizing agents, surfactants, acids, fluorine-containing compounds, chelating agents, and salts.

Suitable corrosion inhibitors that may be added to the slurry composition include, for example, benzotriazole, 6-tolylytriazole, 1-(2,3-dicarboxypropyl)benzotriazole, carboxylic acids and mixtures thereof. The corrosion inhibitor may be present in the slurry in a concentration of about 0.001% to 10% and is preferably present in a concentration of about 0.003% to 0.05% of the total weight of the slurry. The preferred corrosion inhibitor is benzotriazole (BTA) and is most preferably present in a concentration of about 0.005% to 0.015% of the total weight of the slurry.

Suitable amines that may be added to the slurry composition include, for example, ammonia, hydroxylamine, monoethanolamine, diethanolamine, triethanolamine, diethyleneglycolamine, N-hydroxylethylpiperazine, and mixtures thereof. The amines may be present in the slurry composition in a concentration of about 0.001% to 10%, and are preferably present in a concentration of about 0.005% to 5% of the total weight of the slurry. The preferred amine is ammonia and is most preferably present in a concentration of about 0.01% to 0.03% of the total weight of the slurry.

It has been found that the inclusion of small amounts of a chemical activity enhancer, such as, ammonia and a corrosion inhibitor, such as, BTA, in the slurry composition results in the appropriate adjustment of the copper layer removal rate without any increase in static etch rates, which causes the topography to increase. This is demonstrated in Table 4 below for a slurry composition having about 6.5 wt. % abrasive particles, normalized 50 $H_2O_2$, and a pH of about 10.

TABLE 4

Copper layer removal rate versus ammonia and BTA concentrations

| Ammonia content % | BTA content % | Copper layer removal rate, Å/min | Static Etch rate, Å/min |
|---|---|---|---|
| 0 | 0 | 250 | ~0 |
| 0.01 | 0 | 500 | Not measured |
| 0.02 | 0.01 | 2000 | ~0 |
| 0.02 | 0.0125 | 1000 | ~0 |

In order to maintain the pH of the slurry composition, a stabilizing agent may be added so that the pH of the slurry is about 8 to 10.5. Suitable stabilizing agents include, for example, ammonium hydroxide and potassium hydroxide. These stabilizing agents may be present in the slurry in a concentration of about 0.1% to 5%, and more preferably in a concentration of about 0.2% to 1% of the total weight of the slurry.

Suitable surfactant compounds that may be added to the slurry composition include, for example, any of the numerous nonionic, anionic, cationic, or amphoteric surfactants known to those skilled in the art. The surfactant compounds may be present in the slurry composition in a concentration of about 0.05% to 1% and are preferably present in a concentration of about 0.07% to 0.5% of the total weight of the slurry. The preferred types of surfactants are nonionic, anionic, and mixtures thereof and are most preferably present in a concentration of about 0.075% to 0.4% of the total weight of the slurry.

Suitable acid compounds that may be added to the slurry composition, to adjust the pH of the composition, include, for example, formic acid, acetic acid, propanoic acid, butanoic acid, pentanoic acid, hexanoic acid, heptanoic acid, octanoic acid, nonanoic acid, lactic acid, hydrochloric acid, nitric acid, phosphoric acid, sulfuric acid, hydrofluoric acid, malic acid, tartaric acid, gluconic acid, citric acid, phthalic acid, pyrocatechoic acid, pyrogallol carboxylic acid, gallic acid, tannic acid, and mixtures thereof. The acid compound may be present in the slurry composition in a concentration of about 0.1% to 2% of the total weight of the slurry. The preferred acid is propanoic acid, most preferably in a concentration of about 0.2% to 0.5% of the total weight of the slurry.

It has been found that carboxylic acids, if added, may also impart corrosion inhibition properties to the slurry composition, in addition to adjusting the pH of the composition.

To increase the selectivity of tantalum and tantalum compounds relative to silicon dioxide, fluorine-containing compounds may be added to the slurry composition. Suitable fluorine-containing compounds include, for example, hydrogen fluoride, perfluoric acid, alkali metal fluoride salt, alkaline earth metal fluoride salt, ammonium fluoride, tetramethylammonium fluoride, ammonium bifluoride, ethylenediammonium difluoride, diethylenetriammonium trifluoride, and mixtures thereof The fluorine-containing compounds may be present in the slurry composition in a concentration of about 0.1% to 5%, and are preferably present in a concentration of about 0.25% to 1% of the total weight of the slurry. The preferred fluorine-containing compound is tetramethylammonium fluoride, most preferably in a concentration from about 0.3% to 0.8% of the total weight of the slurry.

Suitable chelating agents that may be added to the slurry composition include, for example, ethylenediaminetetracetic acid (EDTA), N-hydroxyethylethylenediaminetriacetic acid (NHEDTA), nitrilotriacetic acid (NTA), diethylklenetriaminepentacetic acid (DPTA), ethanoldiglycinate, and mixtures thereof. The chelating agents may be present in the slurry composition in a concentration of about 0.05% to 1%, and are preferably present in a concentration of about 0.1% to 0.75% of the total weight of the slurry. The preferred chelating agent is EDTA and is most preferably present in a concentration of about 0.15% to 0.5% of the total weight of the slurry.

Suitable salts that may be added to the slurry composition include, for example, ammonium persulfate, potassium persulfate, potassium sulfite, potassium carbonate, potassium propionate, ammonium nitrate, potassium hydrogen phthalate, hydroxylamine sulfate, and mixtures thereof. The salts may be present in the slurry composition in a concentration of about 0.1% to 5%, and are preferably present in a concentration of about 0.25% to 1% of the total weight of the slurry. The preferred salt is ammonium persulfate and is most preferably present in a concentration of about 0.3% to 0.75% of the total weight of the slurry.

The CMP method of the present invention involves a two step process wherein the CMP slurry composition is used to polish a substrate with at least one metal layer, such as, copper, tungsten, tantalum, aluminum, titanium, and combinations thereof. The CMP method reduces both the amount of defects and oxide thinning/total copper loss on the metal layers polished, as compared to a process employing a high copper removal rate slurry alone.

The substrate polishing process comprises the steps of: applying to a metal layer a slurry composition comprising a silica dispersion and an oxidizer, wherein the silica dispersion has a large particle count of less than about 150,000 particles having a particle size of greater than about 0.5 $\mu$m in a 30 $\mu$L sample; and chemically mechanically polishing the metal layer with the slurry composition.

This invention is explained below in further detail with reference to Example 1, which is not by way of limitation, but by way of illustration.

EXAMPLE 1

A filtered CMP slurry composition, which reduces the TEOS layer removal rate (oxide thinning) and the chatter mark defect rate, was prepared having the following components and properties: about 6.5% to 8% fumed silica dispersion, about 0.005% to 0.015% $H_2O_2$, about 0.005% to 0.015% BTA, about 0.01% to 0.03% ammonia, and a pH of about 8 to 10.5. For these ranges, several wafers were polished and the following results, shown in Table 5 below, were achieved versus the prior art, unfiltered control slurry, which comprised 10% fumed silica dispersion, 0.2% $H_2O_2$, and 0.005% BTA.

TABLE 5

Properties of a filtered CMP slurry composition versus an unfiltered prior art slurry composition.

|  | Control Slurry | Improved slurry |
|---|---|---|
| Copper layer removal rate Å/min | 800–1000 | 800–1000 |
| Tantalum layer removal rate Å/min | 550–750 | 450–600 |
| TEOS layer removal rate Å/min | 1350–1700 | 1000–1200 |
| Static etch rate | 0 | 0 |
| Chatter mark defects | 25 | <10 |
| Dishing 50 micron lines | 100–300 Å | 500 Å max |
| Erosion Fine Lines max | 50–200 Å | 400 Å max |

As is evident by the results summarized in Table 5 above, the slurry of the present invention achieved fewer chatter mark defects, and a reduced TEOS layer removal rate, over the prior art control slurry. This was achieved while still maintaining comparable and acceptable copper and tantalum removal rates and erosion fine line characteristics compared to the prior art control slurry.

The present invention has been described with particular reference to the preferred forms thereof. It will be obvious to one of ordinary skill in the art that changes and modifications may be made therein without departing from the spirit and scope of the present invention as defined by the following claims.

What is claimed is:

1. A method of reducing defects on a metal layer, comprising the steps of:

(a) applying to a metal layer a slurry composition comprising a silica dispersion and an oxidizer, wherein said silica dispersion has a large particle count of less than about 150,000 particles having a particle size of greater than about 0.5 $\mu$m in a 30 $\mu$L sample; and (b) chemically mechanically polishing said metal layer with said slurry composition.

2. The method of claim 1, wherein said metal layer is selected from the group consisting of: copper, tungsten, tantalum, aluminum, titanium, and combinations thereof.

* * * * *